(12) United States Patent
Tsukamoto et al.

(10) Patent No.: US 7,755,740 B2
(45) Date of Patent: Jul. 13, 2010

(54) EXPOSURE APPARATUS

(75) Inventors: Izumi Tsukamoto, Tokyo (JP); Hideki Nogawa, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 370 days.

(21) Appl. No.: 12/024,332

(22) Filed: Feb. 1, 2008

(65) Prior Publication Data

US 2008/0187872 A1    Aug. 7, 2008

(30) Foreign Application Priority Data

Feb. 7, 2007   (JP) .............................. 2007-027463
Dec. 26, 2007  (JP) .............................. 2007-334573

(51) Int. Cl.
*G03B 27/42*   (2006.01)
*G03B 27/52*   (2006.01)

(52) U.S. Cl. .......................................... 355/53; 355/30

(58) Field of Classification Search .................. 355/30, 355/53, 72, 76; 250/548

See application file for complete search history.

(56) References Cited

U.S. PATENT DOCUMENTS 7,349,064 B2 *  3/2008  Nakano ........................ 355/30
7,443,482 B2 * 10/2008  Novak et al. .................. 355/30
2004/0160582 A1  8/2004  Lof
2006/0209280 A1  9/2006  Makita et al.

FOREIGN PATENT DOCUMENTS

JP        10303114 A    11/1998
JP        2006-261607 A   9/2006
WO        WO99/49504  *  3/1998

* cited by examiner

*Primary Examiner*—Hung Henry Nguyen
(74) *Attorney, Agent, or Firm*—Canon U.S.A., Inc. I.P. Division

(57) ABSTRACT

An exposure apparatus exposing a plurality of shot areas on a substrate to light through a liquid includes a movable stage including a chuck configured to hold the substrate and a plate arranged around of the chuck, a projection optical system configured to project a light through an original onto the substrate held by the chuck, a first liquid supply nozzle arranged along a periphery of a final optical element of the projection optical system, and a plurality of second liquid supply nozzles arranged on the stage. The exposure apparatus supplies the liquid to a gap between the final optical element and the substrate through the first liquid supply nozzle. The exposure apparatus selects a nozzle for supplying the liquid from among the plurality of second liquid supply nozzles based on a location of an exposure shot area on the substrate.

7 Claims, 5 Drawing Sheets

EXPOSURE APPARATUS

BACKGROUND OF THE INVENTION

1. Field of the Invention

The present invention relates to an exposure apparatus configured to expose a substrate to light through a liquid filled in a gap between the substrate and a final optical element of a projection optical system configured to project light through an original onto the substrate.

2. Description of the Related Art

Conventionally, a reduced projection exposure apparatus is used for manufacturing fine semiconductor devices such as a semiconductor memory or a logic circuit or liquid crystal display devices using a photolithography technique. The reduced projection exposure apparatus projects a circuit pattern formed on an original onto a substrate by a projection optical system and transfers the circuit pattern. The original is a reticle, a mask, or the like. The substrate is a semiconductor wafer, a glass substrate, or the like.

A minimum pattern size which can be transferred to the substrate by the reduced projection exposure apparatus (i.e., a resolution of the reduced projection exposure apparatus) is proportional to a wavelength of a light used in the exposure but is inversely proportional to a numerical aperture (NA) of the projection optical system. Thus, higher resolution can be achieved by reducing the wavelength or by increasing the NA. In recent years, according to a growing demand for higher-density circuit patterns, higher resolution capabilities have become important. Accordingly, increased NA of the projection optical system is expected as well as the implementation of reduced wavelength of the exposure light. Currently, development of the projection optical system with higher NA is making progress with accelerating speed and implementation of an optical system with the NA exceeding 0.9 is to start in the near future.

On the other hand, as a light source with shorter wavelength is demanded, argon fluoride (ArF) laser light source of a 193 nm-wavelength is used in place of krypton fluoride (KrF) laser light source of a 248 nm-wavelength. Currently, as a next generation light source, molecular fluorine ($F_2$) laser light source of a 157 nm-wavelength or extreme ultraviolet (EUV) light source of a 13.5 nm-wavelength are being developed.

In the above circumstances, immersion exposure technology is receiving attention as a method for increasing resolution without changing the wavelength of the light source. The immersion exposure technology realizes increased NA by using liquid as a medium on a wafer side of the projection optical system. That is, a gap between a final face of the projection optical system and the wafer surface is filled with liquid. Since NA=n·sin θ, wherein n is the refractive index of the medium, the NA of the projection optical system can be up to n-times greater by filling the gap with a medium having a refractive index higher than that of air, i.e., n>1. Since the NA can be increased, the resolution can be improved as described above.

The immersion exposure method includes two methods: a local fill method in which a localized area of a wafer is immersed in liquid and a full field method by which a wafer surface is entirely immersed in liquid during exposure. The present invention relates to the local fill type exposure apparatus.

What is important in the immersion exposure of the local fill method is to completely fill the gap between the final face of the projection optical system or the final optical element, and an exposure area in the surface of the substrate (the wafer which is exposed) with liquid and to maintain this state during the exposure. The exposed substrate, such as a silicon wafer from which semiconductor chips such as an IC or a LSI are manufactured, is generally circular while the exposure area is generally rectangular. Thus, the above-described ideal immersion state is difficult to obtain when the exposure area is at the periphery of the wafer due to the curved configuration of the wafer. It is to be noted that in the following description, the exposure area may be referred to as an exposure target shot or an exposure target shot area.

For example, the volume of liquid that is necessary in filling the gap between the final optical element of the projection optical system and the wafer changes greatly when the exposure area is at the periphery of the wafer compared to when the exposure area is at the central area of the wafer. Thus, an ordinary immersion liquid supply mechanism is not practical in the exposure of the periphery of the wafer unless the amount of liquid supplied to the exposure shot area is changed according to its location. In other words, some complementary function is necessary in immersing an exposure shot area adjacent to a peripheral portion of the wafer in the conventional immersion exposure apparatus.

SUMMARY OF THE INVENTION

The present invention is directed to an exposure apparatus which is capable of favorably immersing an exposure shot area adjacent to a periphery of a substrate in liquid.

According to an aspect of the present invention, an exposure apparatus for exposing a plurality of shot areas on a substrate to light through a liquid includes a movable stage including a chuck configured to hold the substrate and a plate arranged around of the chuck, a projection optical system configured to project a light through an original onto the substrate held by the chuck, a first liquid supply nozzle arranged along a periphery of a final optical element of the projection optical system, and a plurality of second liquid supply nozzles arranged on the stage. The exposure apparatus supplies the liquid to a gap between the final optical element and the substrate through the first liquid supply nozzle. The exposure apparatus selects a nozzle for supplying the liquid from among the plurality of the second liquid supply nozzles based on a location of an exposure shot area on the substrate or based on a location of an exposure shot area on the substrate and a drive condition (direction) of the stage and supplies the liquid to a gap between the chuck and the plate using the selected second liquid supply nozzle.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Figure 1:
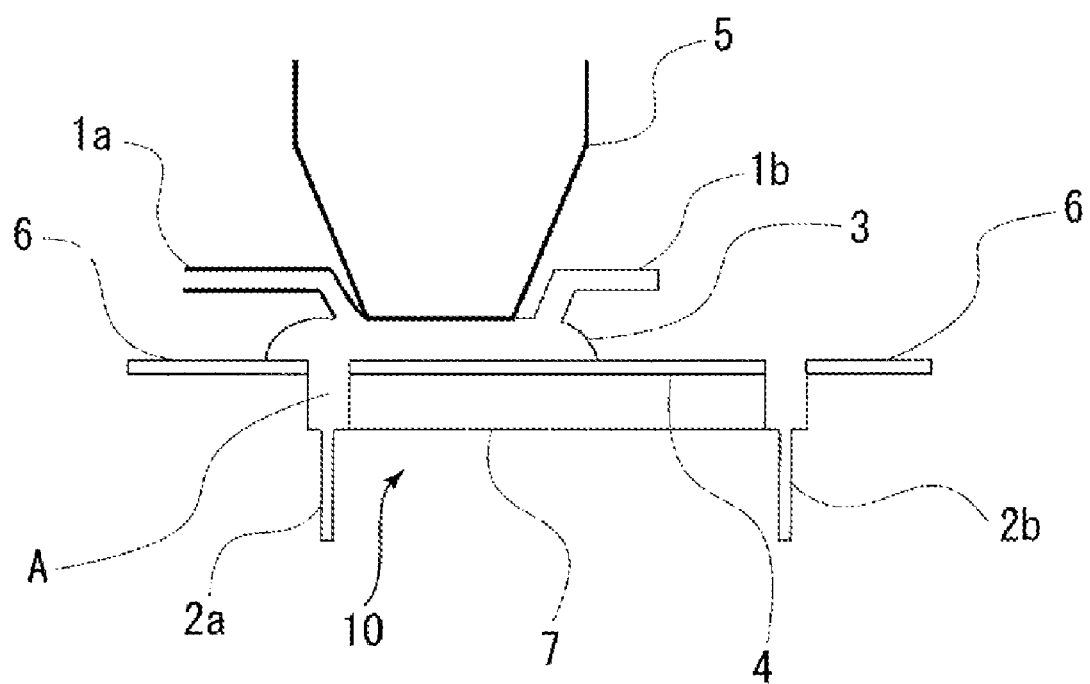
FIG. 1 illustrates an example configuration of an immersion mechanism of an immersion exposure apparatus according to a first exemplary embodiment of the present invention.

Various exemplary embodiments, features, and aspects of the invention will be described in detail below with reference to the drawings.

An exposure apparatus according to an exemplary embodiment of the present invention includes a chuck configured to hold a wafer (substrate) and a movable stage including a plate which is arranged around of the chuck and has a substantially flush surface with a wafer held by the chuck. The exposure apparatus further includes a projection optical system configured to project a light from a reticle (original) to the wafer held by the chuck and a first liquid supply nozzle arranged along a periphery of the final optical element. A liquid is supplied through the first liquid supply to a gap between the final optical element and the wafer. The wafer which is held by the chuck is exposed to the light through the liquid filled in the gap. Furthermore, the exposure apparatus includes a second liquid supply nozzle which is provided on the stage. A liquid is supplied through the second liquid supply nozzle to a gap between the chuck and the plate. Preferably, a plurality of the second liquid supply nozzles are arranged around of the chuck.

When an area at the periphery of the wafer is exposed to light by the exposure apparatus of the present invention, immersion liquid is supplied through the second liquid supply nozzle arranged at the wafer periphery in the vicinity of the shot area. The immersion liquid is supplied through the second liquid supply nozzle in order to adjust the volume of the immersion liquid which is to be filled in the gap. This is effective as the change in the volume of the immersion liquid necessary in covering the shot area at the periphery of a wafer is greater than that at the central area of the wafer.

The supply of liquid through the second liquid supply nozzle is controlled based on a position of the exposure shot area on the wafer (substrate) and a drive condition of the stage. Based on an exposure shot area on the wafer and a drive condition of the stage, a second liquid supply nozzle for supplying the liquid is selected from a plurality of the second liquid supply nozzles, and the liquid is supplied through the selected second liquid supply nozzle. The amount of liquid which needs to be supplied through the second liquid supply nozzle, that is, a difference between the volume of the immersion liquid supplied to the shot area and to the central area of the wafer, and the timing of supply are calculated in advance according to the location of the exposure shot area on the wafer and the drive condition of the wafer stage. Further, since the arrangement of the exposure shot area on the wafer and the drive condition of the wafer stage are obtained by the exposure apparatus, the amount of liquid and the timing can be automatically controlled.

Further, since a level of the immersion liquid surface changes when a speed of the wafer stage is changed, a liquid gauge is set in the gap between the chuck and the plate. This liquid gauge is configured to measure the level of the liquid in the gap. The liquid supplied through the second liquid supply nozzle can be controlled based on the measured liquid level.

The exposure apparatus according to the present invention further includes a first liquid recovery nozzle arranged at the periphery of the final optical element of the projection optical system and a second liquid recovery nozzle arranged on the stage. The liquid is recovered from a gap between the final optical element and the wafer held by the chuck through the first liquid recovery nozzle. The liquid is also recovered from a gap between the chuck and the plate (flat plate) through the second liquid recovery nozzle. In this case, the recovery of the liquid from the second liquid recovery nozzle is controlled based on a location of the exposure shot area on the wafer and the drive condition of the stage. For example, in a case the wafer is exposed from the outer side of the wafer toward the inner side, the amount of liquid that becomes unnecessary as the final optical element approaches the inner side of the wafer is recovered by the second liquid recovery nozzle.

Since the immersion liquid deteriorates as time passes, the immersion liquid in the gaps may be recovered at the time the wafer is replaced so that a new immersion liquid can be supplied for the next wafer.

First Exemplary Embodiment

FIG. 1 illustrates a cross section of an immersion exposure apparatus according to a first exemplary embodiment of the present invention. Nozzles 1a and 1b are first liquid supply/recovery nozzles, which are ordinary liquid supply/recovery nozzles, configured to recover as well as supply the immersion liquid. Nozzles 2a and 2b are second liquid supply nozzles configured to supply the immersion liquid when the exposure area is a periphery of a wafer. Further, the immersion exposure apparatus includes an immersion liquid 3, a wafer (substrate) 4, a projection lens (projection optical system) 5, a plate (flat plate) 6, a chuck 7 configured to hold the wafer 4, a wafer stage 10 and the plate 6. The wafer stage 10 is movable and includes the chuck 7 and the plate 6. A portion "A" indicates a gap between the wafer 4 and the plate 6.

When the exposure area is the periphery of the wafer 4, the volume which has to be immersed increases compared to when the central area of the wafer is exposed, due to a gap such as a margin portion A in FIG. 1, and the influence of a wafer edge. The portion A is used when the wafer is replaced. The increase and decrease of the volume to be immersed is complemented and an appropriate immersion state is maintained owing to a supply of the immersion liquid through the nozzle 2a. The nozzle 2a has a function of supplying the immersion liquid similar to the nozzles 1a and 1b which are ordinary liquid supply/recovery nozzles.

The timing and amount of supply of the liquid through the nozzle 2a (i.e., the second liquid supply nozzle) can be calculated since the exposure area and the drive condition of the wafer stage, for example, speed, acceleration, and direction, is obtained by the exposure apparatus. Thus, the supply of liquid through the nozzle 2a can be automatically performed under control of software in the exposure apparatus. The immersion liquid is not supplied through the nozzle 2b since the nozzle 2b is distant from the exposure area (exposure shot area).

Second Exemplary Embodiment

Another embodiment is provided which utilizes a plurality of the nozzles 2a and 2b.

Figure 2:
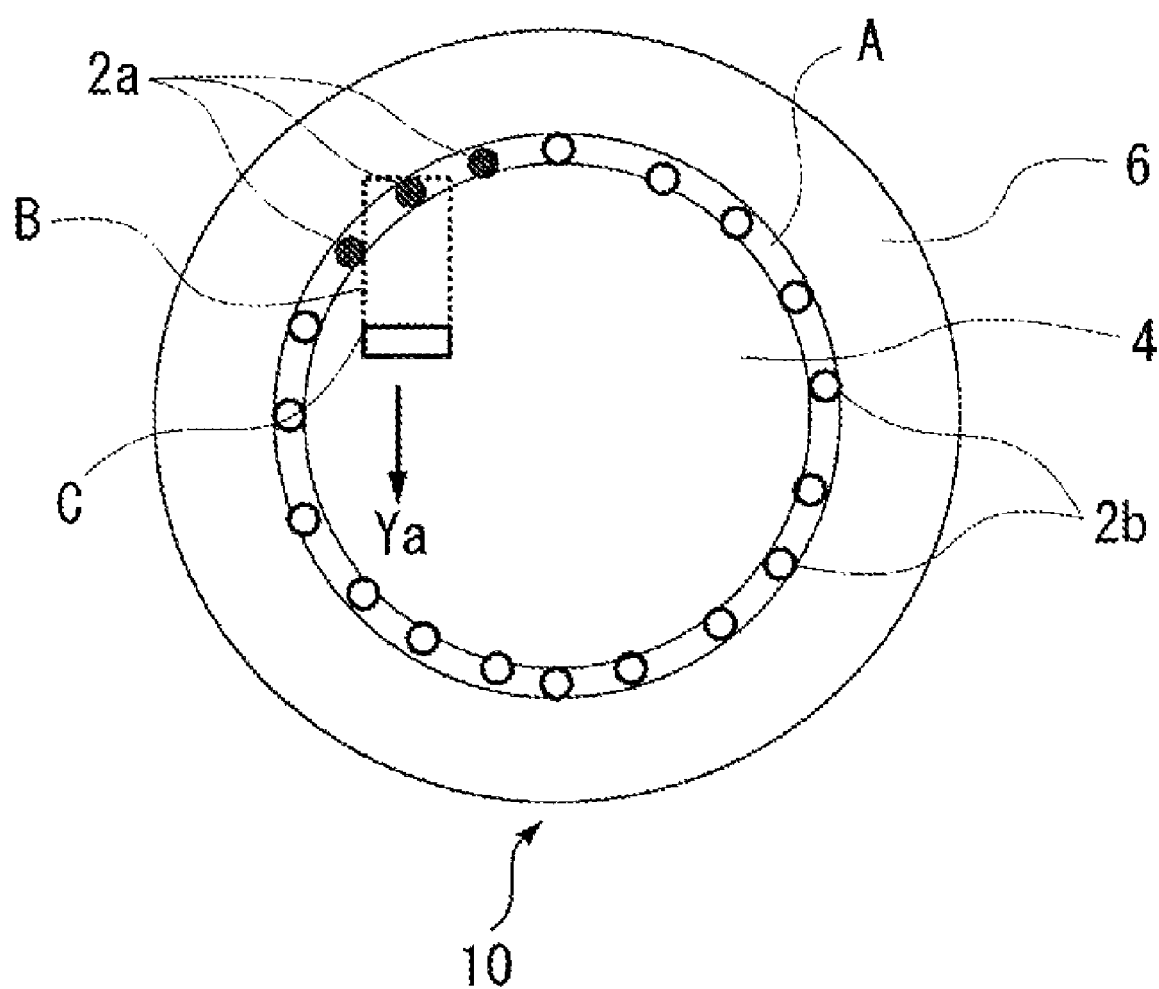
FIG. 2 is a top view of a wafer stage illustrated in FIG. 1.

FIG. 2 is an example of a cross section of FIG. 1 in which FIG. 1 (cross section by the vertical plane) is viewed from above. An exposure area (portion B) at the periphery of the wafer is scanned and exposed all over to light as the wafer stage 10 moves against the exposure portion (portion C)

where the light is projected from the projection lens 5. On the wafer stage 10, the wafer 4, the chuck 7, and the plate 6 are mounted.

In FIG. 2, the wafer stage 10 scans in a direction Ya. When the wafer stage 10 scans in the direction Ya, the exposure portion (portion C) is moved to the periphery of the wafer 4. Since the portion A is to be filled with liquid, immersion liquid is supplied through the nozzles 2a. Since the nozzles 2b are away from the exposure area, the immersion liquid is not supplied through the nozzles 2b. In this way, a case where the portion A is immersed in liquid can be easily determined according to the drive condition of the wafer stage 10. Thus, immersion liquid can be selectively supplied to the portion A from the nozzles which are in the vicinity of the portion A.

Further, according to the drive condition of the wafer stage 10, the nozzles which are not used in the supply of the immersion liquid can be determined. Accordingly, the immersion liquid, which is no longer necessary, can be selectively recovered from the nozzles which are not used. It is to be noted that one nozzle may have the supply function as well as the recovery function of the immersion liquid, however, a supply-only nozzle and a recovery-only nozzle may also be arranged at a plurality of locations due to pollution of the immersion liquid.

Third Exemplary Embodiment

Figure 3:
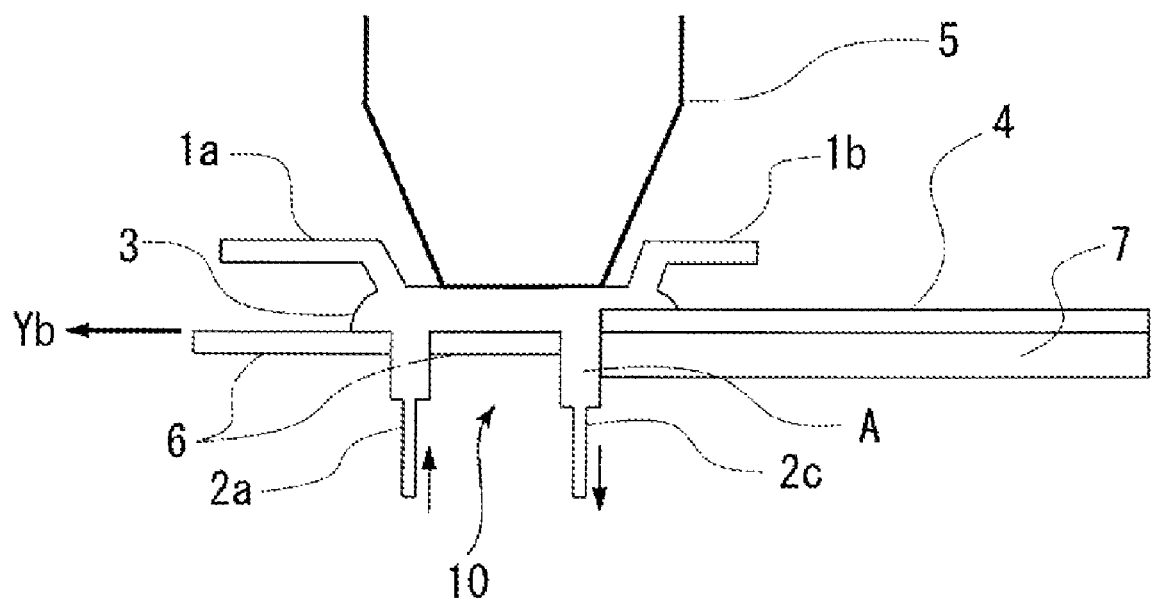
FIG. 3 illustrates an example configuration of an immersion mechanism of an immersion exposure apparatus according to a third exemplary embodiment of the present invention.

FIG. 3 illustrates an example configuration of an immersion mechanism of an immersion exposure apparatus according to a third exemplary embodiment of the present invention. This configuration is especially effective in a case where the surface of the wafer 4 is not on a level with the surface of the plate 6. In the present exemplary embodiment, the wafer stage 10 is driven in a direction Yb which causes the exposure area under the projection lens 5 to move relatively to the inner side of the wafer 4 from the outer side. In this case, at first, compared to when the central part of the wafer 4 is exposed, the volume of liquid which is necessary in the immersion increases rapidly. For this reason, the immersion liquid needs to be supplied through the nozzle 2a as well as the nozzle 1a. However, the volume of the liquid necessary in the immersion decreases when the projection lens 5 is moved to the inner side of the wafer 4. The unnecessary liquid is then recovered by a nozzle 2c (the second liquid recovery nozzle) as well as the nozzle 1b which is an ordinary immersion liquid supply/recovery nozzle (the first liquid recovery nozzle). In order to prevent leakage of the liquid to the exterior of the plate 6, the nozzle 2c may be arranged in the outside of the plate.

Fourth Exemplary Embodiment

Figure 4:
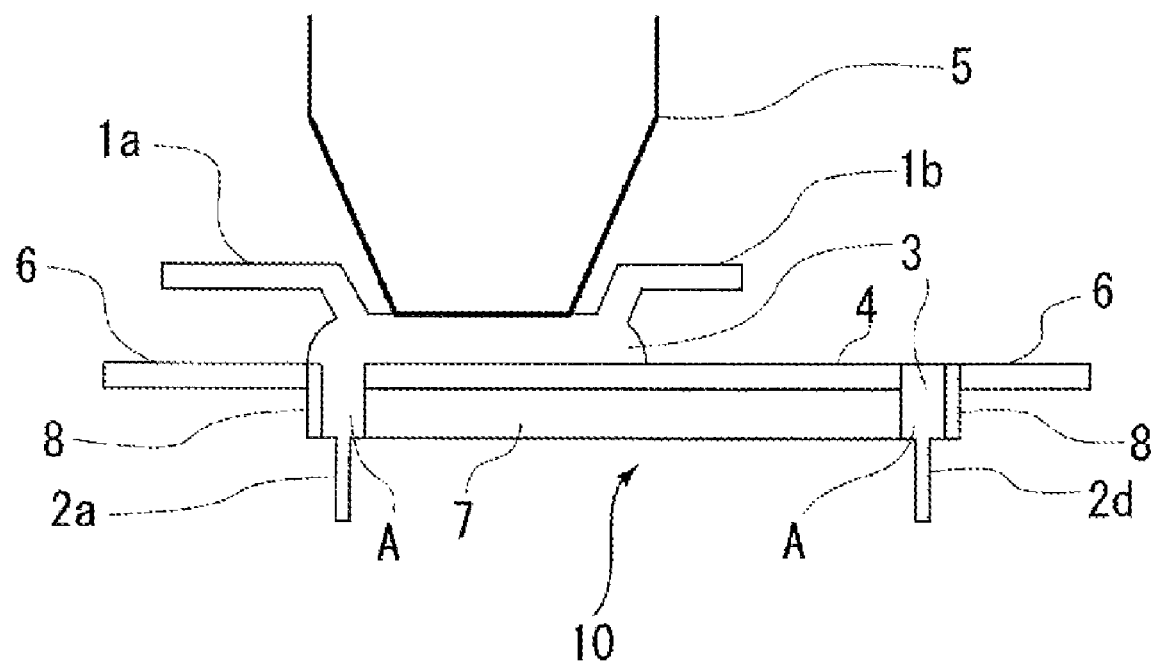
FIG. 4 illustrates an example configuration of an immersion mechanism of an immersion exposure apparatus according to a fourth exemplary embodiment of the present invention.

FIG. 4 illustrates an example configuration of an immersion mechanism of an immersion exposure apparatus according to a fourth exemplary embodiment of the present invention. This configuration is especially effective in a case where the surface of the wafer 4 is on a level with the surface of the plate 6. The immersion exposure apparatus includes nozzles 2a and 2d which are the second liquid supply nozzles and a water level monitor 8. The amount of immersion liquid supplied through the nozzles 2a and 2d which are arranged at the periphery of the wafer 4 is controlled according to a measurement result of the water level monitor 8. Thus, the liquid level of the liquid that covers the wafer 4 comes level with the liquid level of the liquid that covers the plate 6 at all times. In this way, the liquid level of the liquid covering the plate 6, the portion A, and the wafer 4 will be on a level. Accordingly, the wafer 4 can be appropriately and easily immersed in the liquid independent of the location of the exposure area portion B on the wafer 4.

According to the abovementioned exemplary embodiments, an appropriate immersion state can be maintained in a local-fill type immersion exposure apparatus even when the exposure area is the periphery of the wafer and independent of the state of the wafer periphery or the vicinity of the wafer.

Fifth Exemplary Embodiment

Next, manufacturing processes of a micro device (a semiconductor chip such as IC and LSI, liquid crystal panel, CCD, thin film magnetic head, micromachine, etc.) using the above-described exposure apparatus will be described.

Figure 5:
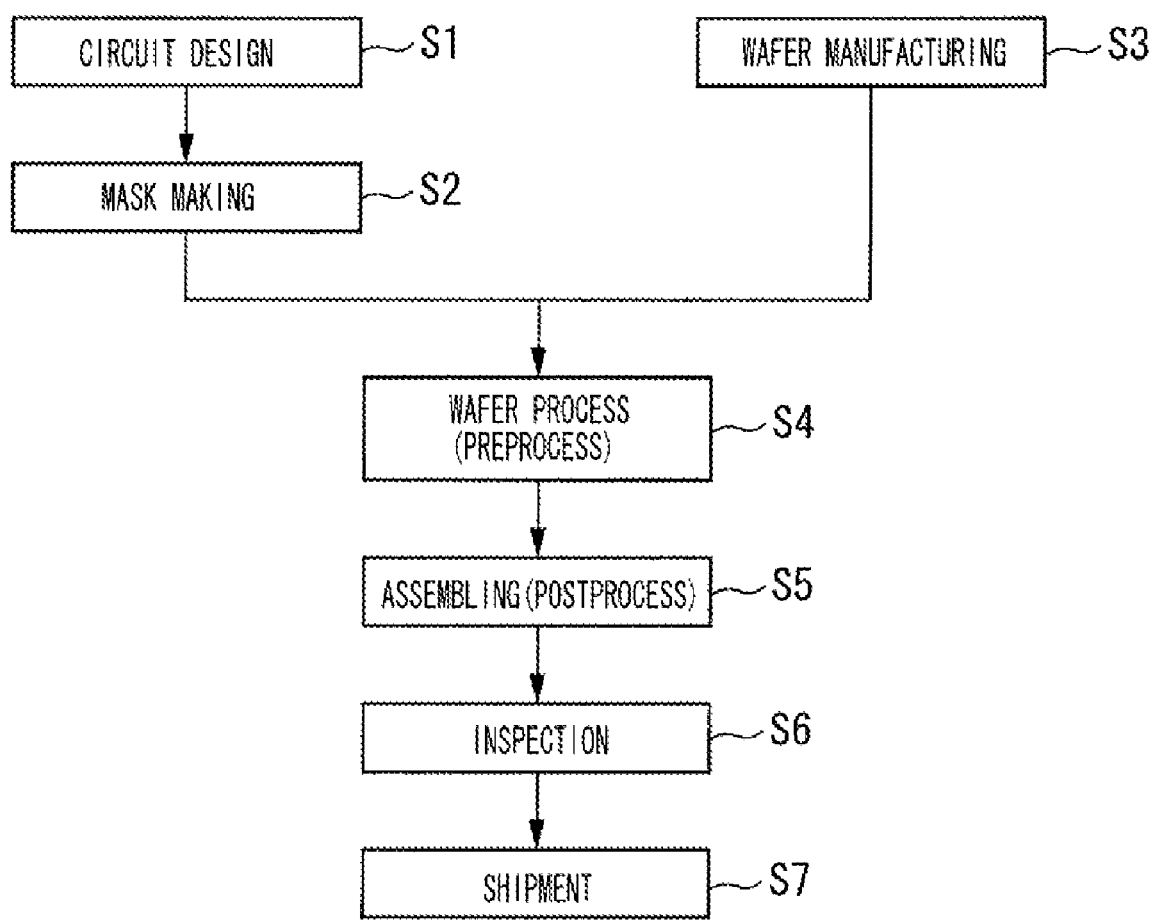
FIG. 5 illustrates an example manufacturing process of a device.

FIG. 5 is a flowchart illustrating exemplary manufacturing processes of a semiconductor device.

Step S1 is a circuit design process for designing a circuit of a semiconductor device. Step S2 is a mask making process for fabricating a mask, which can be referred to as an original or a reticle, based on a designed circuit pattern.

Step S3 is a wafer manufacturing process for manufacturing a wafer, which can be referred to as a substrate, from a silicon or comparable material. Step S4 is a wafer process, which can be referred to as "preprocess", for forming an actual circuit on a wafer using an exposure apparatus with the above-described prepared mask according to the lithography technique.

Step S5 is an assembling process, which can be referred to as "postprocess", for forming a semiconductor chip using the wafer manufactured in step S4. The postprocess includes an assembly process (e.g., dicing, bonding, etc.) and a packaging process (chip sealing). Step S6 is an inspection process for inspecting the semiconductor device manufactured in step S5. The inspection includes an operation confirmation test and an endurance test. Step S7 is a shipment process for shipping the semiconductor device completed through the above-described processes.

The above-described wafer process in step S4 includes an oxidation step for oxidizing a wafer surface, a chemical vapor deposition (CVD) step for forming an insulating film on the wafer surface, and an electrode formation step for forming electrodes on the wafer by vaporization. Furthermore, the wafer process in step S4 includes an ion implantation step for implanting ions into the wafer, a resist processing step for coating the wafer with a photosensitive material, and an exposure step for exposing the wafer subjected to the resist processing step to light using the above-described exposure apparatus with a mask having a circuit pattern. Furthermore, the wafer process in step S4 includes a developing step for developing the wafer exposed in the exposure step, an etching step for cutting a portion other than a resist image developed in the developing step, and a resist stripping step for removing an unnecessary resist remaining after the etching step. The processing repeating the above-described steps can form multiple circuit patterns on a wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application Nos. 2007-027463 filed Feb. 7, 2007 and 2007-334573 file Dec. 26, 2007 which are hereby incorporated by reference herein in their entirety.

What is claimed is:

1. An exposure apparatus for exposing a plurality of shot areas on a substrate to light through a liquid, the apparatus comprising:

a movable stage including a chuck configured to hold the substrate and a plate arranged around of the chuck;

a projection optical system configured to project a light through an original onto the substrate held by the chuck;

a first liquid supply nozzle arranged along a periphery of a final optical element of the projection optical system; and a plurality of second liquid supply nozzles arranged on the stage;

wherein the exposure apparatus supplies the liquid to a gap between the final optical element and the substrate through the first liquid supply nozzle; and wherein the exposure apparatus selects a nozzle for supplying the liquid from among the plurality of the second liquid supply nozzles based on a location of an exposure shot area on the substrate and supplies the liquid to a gap between the chuck and the plate using the selected second liquid supply nozzle.

2. The exposure apparatus according to claim 1, wherein a plurality of the second liquid supply nozzles are arranged around of the chucks.

3. The exposure apparatus according to claim 1, further comprising a level gauge configured to measure a level of the liquid in the gap between the chuck and the plate, wherein the exposure apparatus controls a supply of the liquid through the second liquid supply nozzles based on the measured liquid level.

4. The exposure apparatus according to claim 1, further comprising a first liquid recovery nozzle arranged along a periphery of the final optical element of the projection optical system and a plurality of second liquid recovery nozzles arranged on the stage;

wherein the exposure apparatus recovers the liquid from the gap between the final optical element and the substrate held by the chuck through the first liquid recovery nozzle; and wherein the exposure apparatus selects a nozzle configured to recover the liquid from the plurality of the second liquid recovery nozzles based on a location of the exposure shot area on the substrate, or based on a location of the exposure shot area on the substrate and a drive condition of the stage, and recovers the liquid from the gap between the chuck and the plate through the selected second liquid recovery nozzle.

5. The exposure apparatus according to claim 4, wherein the plurality of the second liquid recovery nozzles are arranged around of the chuck.

6. A device manufacturing method utilizing an exposure apparatus for exposing a plurality of shot areas on a substrate to light through a liquid, the apparatus including, a movable stage including a chuck configured to hold the substrate and a plate arranged around of the chuck;

a projection optical system configured to project a light through an original onto the substrate held by the chuck;

a first liquid supply nozzle arranged along a periphery of a final optical element of the projection optical system; and a plurality of second liquid supply nozzles arranged on the stage;

wherein the exposure apparatus supplies the liquid to a gap between the final optical element and the substrate through the first liquid supply nozzle; and wherein the exposure apparatus selects a nozzle for supplying the liquid from among the plurality of the second liquid supply nozzles based on a location of an exposure shot area on the substrate and supplies the liquid to a gap between the chuck and the plate using the selected second liquid supply nozzle; the method including:

exposing a substrate to light using the exposure apparatus; and developing the substrate exposed to light.

7. An exposure apparatus for exposing a plurality of shot areas on a substrate to light through a liquid, the apparatus comprising:

a movable stage including a chuck configured to hold the substrate and a plate arranged around of the chuck;

a projection optical system configured to project a light through an original onto the substrate held by the chuck;

a first liquid supply nozzle arranged along a periphery of a final optical element of the projection optical system; and a plurality of second liquid supply nozzles arranged on the stage;

wherein the exposure apparatus supplies the liquid to a gap between the final optical element and the substrate through the first liquid supply nozzle; and wherein the exposure apparatus selects a nozzle for supplying the liquid from among the plurality of the second liquid supply nozzles based on a location of an exposure shot area on the substrate and a drive condition of the stage and supplies the liquid to a gap between the chuck and the plate using the selected second liquid supply nozzle.

* * * * *